(12) United States Patent
Iimura et al.

(10) Patent No.: US 9,312,196 B2
(45) Date of Patent: Apr. 12, 2016

(54) CURABLE SILICONE COMPOSITION, CURED PRODUCT THEREOF, AND OPTICAL SEMICONDUCTOR

(71) Applicant: Dow Corning Toray Co., Ltd., Tokyo (JP)

(72) Inventors: Tomohiro Iimura, Ichihara (JP); Michitaka Suto, Ichihara (JP); Kazuhiro Nishijima, Ichihara (JP); Kasumi Takeuchi, Ichihara (JP); Haruhiko Furukawa, Ichihara (JP); Yoshitsugu Morita, Ichihara (JP)

(73) Assignee: DOW CORNING TORAY CO., LTD., Chiyoda-Ku, Tokyo (JP)

( * ) Notice: Subject to any disclaimer, the term of this patent is extended or adjusted under 35 U.S.C. 154(b) by 0 days.

(21) Appl. No.: 14/438,695

(22) PCT Filed: Oct. 25, 2013

(86) PCT No.: PCT/JP2013/079653
§ 371 (c)(1),
(2) Date: Apr. 27, 2015

(87) PCT Pub. No.: WO2014/069610
PCT Pub. Date: May 8, 2014

(65) Prior Publication Data
US 2015/0252221 A1  Sep. 10, 2015

(30) Foreign Application Priority Data
Oct. 30, 2012 (JP) .................................. 2012-239671

(51) Int. Cl.
| | | |
|---|---|---|
| H01L 23/29 | (2006.01) | |
| C08L 83/04 | (2006.01) | |
| C08G 77/12 | (2006.01) | |
| C08G 77/20 | (2006.01) | |
| C08G 77/00 | (2006.01) | |
| C09D 183/04 | (2006.01) | |
| H01L 33/56 | (2010.01) | |

(52) U.S. Cl.
CPC .............. *H01L 23/296* (2013.01); *C08G 77/12* (2013.01); *C08G 77/20* (2013.01); *C08G 77/70* (2013.01); *C08G 77/80* (2013.01); *C08L 83/04* (2013.01); *C09D 183/04* (2013.01); *H01L 33/56* (2013.01); *H01L 2224/32245* (2013.01); *H01L 2224/48091* (2013.01); *H01L 2224/48247* (2013.01); *H01L 2224/73265* (2013.01)

(58) Field of Classification Search
USPC .............. 257/788, 791; 525/477, 478; 528/15, 528/31, 32
See application file for complete search history.

(56) References Cited

U.S. PATENT DOCUMENTS

| | | | | |
|---|---|---|---|---|
| 7,625,986 B2 * | 12/2009 | Yoshitake | ............... | C08L 83/04 525/478 |
| 8,614,282 B2 | 12/2013 | Hamamoto et al. | | |
| 2007/0025678 A1 * | 2/2007 | Kushibiki | ............... | C08L 83/04 385/141 |
| 2007/0244214 A1 * | 10/2007 | Yoshitake | ............... | C08L 83/04 523/107 |
| 2008/0185601 A1 * | 8/2008 | Frisch | ................. | B29C 45/0001 257/98 |
| 2009/0118440 A1 | 5/2009 | Nakanishi et al. | | |
| 2010/0276721 A1 * | 11/2010 | Yoshitake | ............ | C08K 5/5425 257/99 |
| 2011/0177342 A1 * | 7/2011 | Itoh | .......................... | C08J 7/045 428/414 |
| 2011/0254047 A1 * | 10/2011 | Yoshitake | ............... | C08L 83/04 257/100 |
| 2012/0056236 A1 | 3/2012 | Hamamoto et al. | | |
| 2014/0319575 A1 * | 10/2014 | Choi | ....................... | H01L 33/56 257/100 |

FOREIGN PATENT DOCUMENTS

| | | |
|---|---|---|
| JP | 2012-052045 A | 3/2012 |
| WO | WO 2014/065432 A1 | 5/2014 |
| WO | WO 2014/065433 A1 | 5/2014 |

OTHER PUBLICATIONS

International Search Report for Application No. PCT/JP2013/079653 dated Dec. 17, 2013, 3 pages.
International Search Report for Application No. PCT/JP2013/079333 dated Apr. 10, 2014, 3 pages.
International Search Report for Application No. PCT/JP2013/079332 dated Apr. 16, 2014, 3 pages.
English language abstract for JP 2012-052045 extracted from espacenet.com database on May 11, 2015, 2 pages.

* cited by examiner

*Primary Examiner* — Marc Zimmer
(74) *Attorney, Agent, or Firm* — Howard & Howard Attorney PLLC

(57) ABSTRACT

The present invention relates to a curable silicone composition comprising: (A) an organopolysiloxane having at least two alkenyl groups in a molecule and represented by the average unit formula; (B) a straight chain organopolysiloxane having at least two alkenyl groups in a molecule and having no silicon-bonded hydrogen atoms; (C) an organosiloxane i) represented by the general formula, an organopolysiloxane ($C_2$) having at least two silicon-bonded hydrogen atoms in a molecule and represented by the average unit formula, or a mixture of components ($C_1$) and ($C_2$); and (D) a hydrosilylation reaction catalyst. The curable silicone composition forms a cured product having a high refractive index and a low gas permeability.

16 Claims, 1 Drawing Sheet

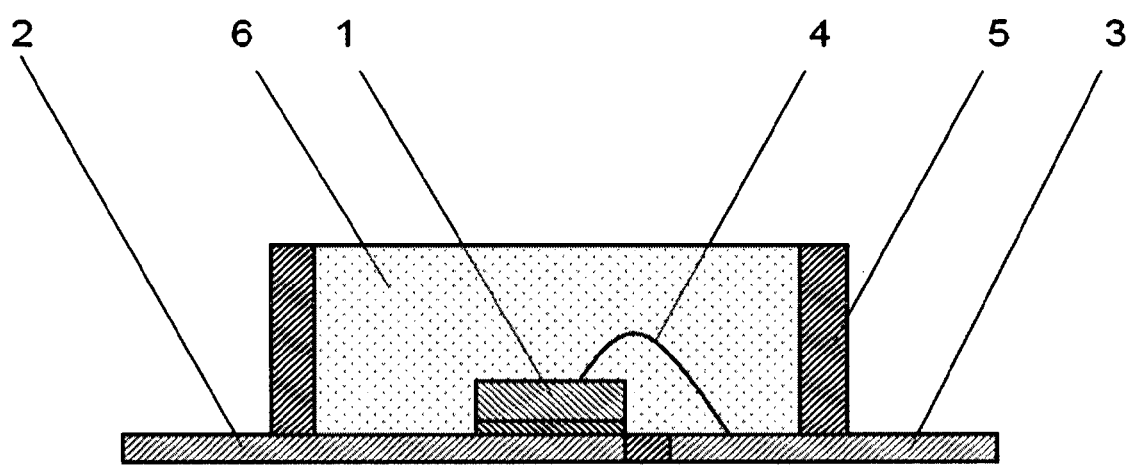

CURABLE SILICONE COMPOSITION, CURED PRODUCT THEREOF, AND OPTICAL SEMICONDUCTOR

RELATED APPLICATIONS

This application is the National Stage of International Patent Application No. PCT/JP2013/079653, filed on Oct. 25, 2013, which claims priority to and all the advantages of Japanese Patent Application No. 2012-239671, filed on Oct. 30, 2012, the content of which is incorporated herein by reference.

TECHNICAL FIELD

The present invention relates to a curable silicone composition, a cured product obtained by curing this composition, and an optical semiconductor device obtained by using this composition.

BACKGROUND ART

Curable silicone compositions are used in sealing materials and protective coating materials for optical semiconductor elements in optical semiconductor devices such as light emitting diodes (LED). However, because cured products of curable silicone compositions exhibit high gas permeability, in cases where such cured products are used in high brightness LEDs, which exhibit high light intensity and generate large amounts of heat, problems occur such as discoloration of the sealing material due to corrosive gases and a reduction in brightness due to corrosion of silver plated on the LED substrate.

As a result, Japanese Unexamined Patent Application Publication No. 2012-052045 proposes a curable silicone composition comprising a branched chain organopolysiloxane having a methylphenylvinylsiloxane unit, an organohydrogenpolysiloxane and an addition reaction catalyst as a curable silicone composition that forms a cured product having low gas permeability.

However, Japanese Unexamined Patent Application Publication No, 2012-052045 suggests that the gas permeability of a cured product is reduced by having a molecular structure of an alkenyl group-containing organopolysiloxane in the curable silicone composition, but does not suggest that the gas permeability of a cured product is reduced by having a molecular structure of an organohydrogenpolysiloxane, which is a crosslinking agent.

An object of the present invention is to provide a curable silicone composition that forms a cured product having a high refractive index and a low gas permeability. In addition, another object of the present invention is to provide a cured product having a high refractive index and a low gas permeability and to provide an optical semiconductor device having excellent reliability.

DISCLOSURE OF INVENTION

The curable silicone composition of the present invention is characterized by comprising:

(A) an organopolysiloxane having at least two alkenyl groups in a molecule and represented by the following average unit formula:

$(R^1R^2{}_2SiO_{1/2})_a(R^3{}_2SiO_{2/2})_b(R^4SiO_{3/2})_c$ wherein, $R^1$ is an alkenyl group having from 2 to 12 carbons; $R^2$ are the same or different, and are each an alkyl group having from 1 to 12 carbons, an alkenyl group having from 2 to 12 carbons, an aryl group having from 6 to 20 carbons, or an aralkyl group having from 7 to 20 carbons; $R^3$ are the same or different, and are each an alkyl group having from 1 to 12 carbons, an alkenyl group having from 2 to 12 carbons, or a phenyl group; $R^4$ is an aryl group having from 6 to 20 carbons, or an aralkyl group having from 7 to 20 carbons; and a, b, and c are numbers that satisfy the following conditions: $0.01 \le a \le 0.5$, $0 \le b \le 0.7$, $0.1 \le c < 0.9$, and $a+b+c=1$;

(B) a straight chain organopolysiloxane having at least two alkenyl groups in a molecule and having no silicon-bonded hydrogen atoms, in an amount of 0 to 70% by mass of this composition;

(C) an organosiloxane ($C_1$) represented by the following general formula:

$HR^5R^6SiO(R^7{}_2SiO)_nSiR^5R^6H$ wherein, $R^5$ are the same or different, and are each an alkyl group having from 1 to 12 carbons; $R^6$ are the same or different, and are each an aryl group having from 6 to 20 carbons or an aralkyl group having from 7 to 20 carbons; $R^7$ are the same or different, and are each an alkyl group having from 1 to 12 carbons or a phenyl group; and n is a number from 0 to 100, an organopolysiloxane ($C_2$) having at least two silicon-bonded hydrogen atoms in a molecule and represented by the following average unit formula:

$(HR^5R^6SiO_{1/2})_d(HR^5{}_2SiO_{1/2})_e(R^7{}_2SiO_{2/2})_f(R^6SiO_{3/2})_g$ wherein, $R^5$, $R^6$, and $R^7$ are synonymous with those described above; and d, e, f, and g are numbers that satisfy the following conditions: $0.01 \le d \le 0.7$, $0 \le e \le 0.5$, $0 \le f \le 0.7$, $0.1 \le g < 0.9$, and $d+e+f+g=1$, or a mixture of components ($C_1$) and ($C_2$), in an amount such that the number of silicon-bonded hydrogen atoms in this component is from 0.1 to 5 moles per 1 mol of total alkenyl groups in components (A) and (B); and (D) an effective quantity of a hydrosilylation reaction catalyst.

The cured product of the present invention is formed by curing the aforementioned curable silicone composition.

The optical semiconductor device of the present invention is characterized in that an optical semiconductor element is sealed by a cured product of the curable silicone composition.

Effects of Invention

The curable silicone composition of the present invention is characterized by forming a cured product having a high refractive index and a low gas permeability. Furthermore, the cured product of the present invention is characterized by having a high refractive index and a low gas permeability, and the optical semiconductor device of the present invention is characterized by exhibiting excellent reliability.

BRIEF DESCRIPTION OF THE DRAWINGS

FIG. 1 is a cross-sectional view of an LED that is an example of an optical semiconductor device of the present invention.

DETAILED DESCRIPTION OF THE INVENTION

First, the curable silicone composition of the present invention will be described in detail.

The organopolysiloxane for component (A) is a base compound of the present composition, has at least two alkenyl groups in a molecule and is represented by the following average unit formula:

$(R^1R^2{}_2SiO_{1/2})_a(R^3{}_2SiO_{2/2})_b(R^4SiO_{3/2})_c$

In the formula, $R^1$ is an alkenyl group having from 2 to 12 carbons, examples of which include a vinyl group, an allyl group, a butenyl group, a pentenyl group, a hexenyl group, a heptenyl group, an octenyl group, a nonenyl group, a decenyl group, an undecenyl group, and a dodecenyl group, and is preferably a vinyl group.

In addition, $R^2$ are the same or different, and are each an alkyl group having from 1 to 12 carbons, an alkenyl group having from 2 to 12 carbons, an aryl group having from 6 to 20 carbons, or an aralkyl group having from 7 to 20 carbons. Examples of the alkyl groups of $R^2$ include methyl groups, ethyl groups, propyl groups, butyl groups, pentyl groups, hexyl groups, heptyl groups, octyl groups, nonyl groups, decyl groups, undecyl groups, and dodecyl groups, and methyl groups are preferred. In addition, examples of the alkenyl groups of $R^2$ include the same alkenyl groups described for $R^1$. Of these, vinyl groups are preferred. In addition, examples of the aryl groups of $R^2$ include phenyl groups, tolyl groups, xylyl groups, naphthyl groups, anthracenyl groups, phenanthryl groups, pyrenyl groups, and groups obtained by substituting hydrogen atoms in these aryl groups with alkyl groups such as methyl groups or ethyl groups; alkoxy groups such as methoxy groups or ethoxy groups; and halogen atoms such as chlorine atoms or bromine atoms, and a phenyl group or naphthyl group is preferred. In addition, examples of the aralkyl groups of $R^2$ include benzyl groups, phenethyl groups, naphthyl ethyl groups, naphthyl propyl groups, anthracenyl ethyl groups, phenanthryl ethyl groups, pyrenyl ethyl groups, and groups obtained by substituting hydrogen atoms in these aralkyl groups with alkyl groups such as methyl groups or ethyl groups; alkoxy groups such as methoxy groups or ethoxy groups; and halogen atoms such as chlorine atoms or bromine atoms.

In addition, $R^3$ are the same or different, and are each an alkyl group having from 1 to 12 carbons, an alkenyl group having from 2 to 12 carbons, or a phenyl group. Examples of the alkyl groups of $R^3$ include the same alkyl groups described for the aforementioned $R^2$, and the alkyl groups are preferably methyl groups. Examples of the alkenyl groups of $R^3$ include the same alkenyl groups described for the aforementioned $R^1$, and the alkenyl groups are preferably vinyl groups.

In addition, $R^4$ is an aryl group having from 6 to 20 carbons or an aralkyl group having from 7 to 20 carbons. Examples of the aryl groups of $R^4$ include the same aryl groups described for the aforementioned $R^2$, and the aryl groups are preferably phenyl groups or naphthyl groups. In addition, examples of the aralkyl groups of $R^4$ include the same aralkyl groups described for the aforementioned $R^2$.

In addition, a, b, and c are numbers that satisfy the following conditions: $0.01 \leq a \leq 0.5$, $0 \leq b \leq 0.7$, $0.1 \leq c < 0.9$, and $a+b+c=1$, are preferably numbers that satisfy the following conditions: $0.05 \leq a \leq 0.45$, $0 \leq b \leq 0.5$, $0.4 \leq c < 0.85$, and $a+b+c=1$, and are more preferably numbers that satisfy the following conditions: $0.05 \leq a \leq 0.4$, $0 \leq b \leq 0.4$, $0.45 \leq c < 0.8$, and $a+b+c=1$. This is because the gas permeability of the cured product is reduced if a is not less than the lower limit of the above-mentioned range, and stickiness hardly occurs in the cured product if a is not more than the upper limit of the above-mentioned range. In addition, the hardness of the cured product is good and reliability is improved if b is not more than the upper limit of the above-mentioned range. In addition, the refractive index of the cured product is good if c is not less than the lower limit of the above-mentioned range, and the mechanical characteristics of the cured product is improved if c is not more than the upper limit of the above-mentioned range.

The organopolysiloxane for component (A) is represented by the above-mentioned average unit formula, but may contain siloxane units represented by the formula: $R^7{}_3SiO_{1/2}$, siloxane units represented by the formula: $R^8SiO_{3/2}$, or siloxane units represented by the formula: $SiO_{4/2}$ as long as the objective of the present invention is not impaired. Moreover, $R^7$ are the same or different, and are each an alkyl group having from 1 to 12 carbons, an aryl group having from 6 to 20 carbons, or an aralkyl group having from 7 to 20 carbons. Examples of the alkyl groups of $R^7$ include the same alkyl groups described for the aforementioned $R^2$. In addition, examples of the aryl groups of $R^7$ include the same aryl groups described for the aforementioned $R^2$. In addition, examples of the aralkyl groups of $R^7$ include the same aralkyl groups described for the aforementioned $R^2$. In addition, $R^8$ is an alkyl group having from 1 to 12 carbons or an alkenyl group having from 2 to 12 carbons. Examples of the alkyl groups of $R^8$ include the same alkyl groups described for the aforementioned $R^2$. In addition, examples of the alkenyl groups of $R^8$ include the same alkenyl groups described for the aforementioned $R^1$. Furthermore, the organopolysiloxane for component (A) may contain silicon-bonded alkoxy groups, such as methoxy groups, ethoxy, groups, or propoxy groups, or silicon-bonded hydroxyl groups as long as the objective of the present invention is not impaired.

An example of a method for preparing this type of organopolysiloxane is a method of subjecting a silane compound represented by the following general formula (I):

$$R^4SiX_3$$

and a disiloxane represented by the following general formula (II-1):

$$R^1R^2{}_2SiOSiR^1R^2{}_2$$

and/or a silane compound represented by the following general formula (II-2):

$$R^1R^2{}_2SiX$$

to a hydrolysis and condensation reaction in the presence of an acid or alkali.

The silane compound represented by the following general formula (I):

$$R^4SiX_3$$

is a raw material used to introduce a siloxane unit represented by the formula: $R^4SiO_{3/2}$ into the organopolysiloxane. In the formula, $R^4$ is an aryl group having from 6 to 20 carbons or an aralkyl group having from 7 to 20 carbons, is synonymous with the groups described above, and is preferably a phenyl group or a naphthyl group. Further, in the formula, X is an alkoxy group, an acyloxy group, a halogen atom, or a hydroxyl group. Examples of the alkoxy group of X include a methoxy group, an ethoxy group, and a propoxy group. Examples of the acyloxy group of X include an acetoxy group. Examples of the halogen atom of X include a chlorine atom, and a bromine atom.

Examples of this type of silane compound include alkoxysilanes such as phenyltrimethoxysilane, naphthyltrimethoxysilane, anthracenyltrimethoxysilane, phenanthryltrimethoxysilane, pyrenyltrimethoxysilane, phenyltriethoxysilane, naphthyltriethoxysilane, anthracenyltriethoxysilane, phenanthryltriethoxysilane, and pyrenyltriethoxysilane; acyloxysilanes such as phenyltriacetoxysilane, naphthyltriacetoxysilane, anthracenyltriacetoxysilane, phenanthryltriacetoxysilane, and pyrenyltriacetoxysilane; halosilanes such as phenyltrichlorosilane, naphthyltrichlorosilane, anthracenyltrichlorosilane, phenanthryltrichlorosilane, and pyrenyltrichlorosilane; and hydroxysilanes such as phenyltrihydroxysilane, naphthyltrihydroxysilane, anthracenyltrihydroxysilane, phenanthryltrihydroxysilane, and pyrenyltrihydroxysilane.

In addition, the disiloxane represented by the following general formula (II-1):

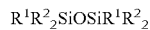
$R^1R^2{}_2SiOSiR^1R^2{}_2$ is a raw material used to introduce a siloxane unit represented by the formula: $R^1R^2{}_2SiO_{1/2}$ into the organopolysiloxane. In the formula, $R^1$ are the same or different, are each an alkenyl group having from 2 to 12 carbons, and examples thereof are the same as the groups described above. In addition, $R^2$ are the same or different, are each an alkyl group having from 1 to 12 carbons, an alkenyl group having from 2 to 12 carbons, an aryl group having from 6 to 20 carbons, or an aralkyl group having from 7 to 20 carbons, and examples thereof are the same as the groups described above.

Examples of this type of disiloxane include 1,3-divinyl-1,1,3,3-tetramethyldisiloxane, 1,3-divinyl-1,3-diphenyl-1,3-dimethyldisiloxane, 1,3-divinyl-1,1,3,3-tetraethyldisiloxane, 1,1,3,3-tetravinyl-1,3-dimethyldisiloxane, and 1,1,1,3,3,3-hexavinyldisiloxane.

In addition, the silane compound represented by the following general formula (II-2):

$R^1R^2{}_2SiX$ is also a raw material used to introduce a siloxane unit represented by the formula: $R^1R^2{}_2SiO_{1/2}$ into the organopolysiloxane. In the formula, $R^1$ are the same or different, are each an alkenyl group having from 2 to 12 carbons, and examples thereof are the same as the groups described above. In addition, $R^2$ are the same or different, are each an alkyl group having from 1 to 12 carbons, an alkenyl group having from 2 to 12 carbons, an aryl group having from 6 to 20 carbons, or an aralkyl group having from 7 to 20 carbons, and examples thereof are the same as the groups described above. Moreover, in the formula, X is an alkoxy group, an acyloxy group, a halogen atom, or a hydroxyl group; and examples thereof are the same as the groups described above.

Examples of this type of silane compound include alkoxysilanes such as methylphenylvinylmethoxysilane, dimethylvinylmethoxysilane, diethylvinylmethoxysilane, dimethylvinylethoxysilane, diethylvinylethoxysilane, methyldivinylmethoxysilane, and trivinylmethoxysilane; acyloxysilanes such as dimethylvinylacetoxysilane, diethylvinylacetoxysilane, methyldivinylacetoxysilane, and trivinylacetoxysilane; halosilanes such as dimethylvinylchlorosilane, diethylvinylchlorosilane, methyldivinylchlorosilane, and trivinylchlorosilane; and hydroxysilanes such as dimethylvinylhydroxysilane, diethylvinylhydroxysilane, methyldivinylhydroxysilane, and trivinylhydroxysilane.

In the above-mentioned preparation method, it is possible, if necessary, to react a silane compound or disiloxane used to introduce a siloxane unit represented by the formula: $R^7{}_3SiO_{1/2}$ into the organopolysiloxane, a silane compound used to introduce a siloxane unit represented by the formula: $R^8SiO_{3/2}$ into the organopolysiloxane, or a silane compound or silane oligomer used to introduce a siloxane unit represented by the formula: $SiO_{4/2}$ into the organopolysiloxane. In the formula, $R^7$ are the same or different, are each an alkyl group having from 1 to 12 carbons, an aryl group having from 6 to 20 carbons, or an aralkyl group having from 7 to 20 carbons, and examples thereof are the same as the groups described above. In addition, $R^8$ is an alkyl group having from 1 to 12 carbons or an alkenyl group having from 2 to 12 carbons, and examples thereof are the same as the groups described above.

Examples of this type of silane compound include alkoxysilanes such as trimethylmethoxysilane, ethyldimethylmethoxysilane, dimethylphenylmethoxysilane, methyldiphenylmethoxysilane, tetramethoxysilane, dimethylphenylethoxysilane, ethyldimethylethoxysilane, methyldiphenylethoxysilane, and tetraethoxysilane; acetoxysilanes such as trimethylacetoxysilane, methyldiphenylacetoxysilane, and tetraacetoxysilane; halosiloxanes such as trimethylchlorosilane, methyldiphenylchlorosilane, and tetrachlorosilane; and hydroxysilanes such as trimethylhydroxysilane, dimethylphenylhydroxysilane, and methyldiphenylhydroxysilane. In addition, examples of this type of silane oligomer include partial hydrolysis products of tetramethoxysilane and partial hydrolysis products of tetraethoxysilane.

In the above-mentioned preparation method, the silane compound (I), the disiloxane (II-1) and/or the silane compound (II-2) and, if necessary, the other silane compounds or silane oligomers are subjected to a hydrolysis and condensation reaction in the presence of an acid or alkali.

Acids that may be used are exemplified by hydrochloric acid, acetic acid, formic acid, nitric acid, oxalic acid, sulfuric acid, phosphoric acid, polyphosphoric acid, polycarboxylic acid, trifluoromethane sulfonic acid, and ion exchange resins. Further, the utilized base is exemplified by inorganic bases such as potassium hydroxide, sodium hydroxide, and the like; and organic base compounds such as triethylamine, diethylamine, monoethanolamine, diethanolamine, triethanolamine, ammonia water, tetramethylammonium hydroxide, alkoxysilanes having an amino group, aminopropyltrimethoxysilane, and the like.

Furthermore, an organic solvent may be used in the preparation method. The utilized organic solvent is exemplified by ethers, ketones, acetates, aromatic or aliphatic hydrocarbons, and γ-butyrolactone; and mixtures of two or more types of such solvents. Preferred organic solvents are exemplified by propylene glycol monomethyl ether, propylene glycol monomethyl ether acetate, propylene glycol monoethyl ether, propylene glycol monopropyl ether, propylene glycol monobutyl ether, propylene glycol mono-t-butyl ether, γ-butyrolactone, toluene, and xylene.

In order to accelerate the hydrolysis and condensation reaction of each of the components in the preparation method, water or a mixed solution of water and alcohol is preferably added. Methanol, ethanol, and isopropyl alcohol are preferred examples of the alcohol. If an organic solvent is used and this reaction is promoted by heating, the reaction is preferably performed at the reflux temperature of the organic solvent.

Component (B) is an optional component used to impart the cured product with softness, extensibility, and flexibility, and is a straight chain organopolysiloxane which has at least two alkenyl groups in a molecule and which has no silicon-bonded hydrogen atoms. Examples of the alkenyl groups in component (B) include alkenyl groups having from 2 to 12 carbons such as vinyl groups, allyl groups, butenyl groups, pentenyl groups, hexenyl groups, heptenyl groups, octenyl groups, nonenyl groups, decenyl groups, undecenyl groups, and dodecenyl groups, and vinyl groups are preferable. Groups bonding to silicon atoms other than alkenyl groups in component (B) include alkyl groups having from 1 to 12 carbons, such as methyl groups, ethyl groups, propyl groups, butyl groups, pentyl groups, hexyl groups, heptyl groups, octyl groups, nonyl groups, decyl groups, undecyl groups, and dodecyl groups; aryl groups having from 6 to 20 carbons, such as phenyl groups, tolyl groups, xylyl groups, naphthyl groups, anthracenyl groups, phenanthryl groups, pyrenyl groups, and groups obtained by substituting hydrogen atoms in these aryl groups with alkyl groups such as methyl groups or ethyl groups, alkoxy groups such as methoxy groups and ethoxy groups and halogen atoms such as chlorine atoms and bromine atoms; aralkyl groups having from 7 to 20 carbons, such as benzyl groups, phenethyl groups, naphthyl ethyl groups, naphthyl propyl groups, anthracenyl ethyl groups, phenanthryl ethyl groups, pyrenyl ethyl groups, and groups obtained by substituting hydrogen atoms in these aralkyl groups with alkyl groups such as methyl groups or ethyl groups, alkoxy groups such as methoxy groups and ethoxy groups and halogen atoms such as chlorine atoms and bromine atoms; and halogenated alkyl groups having from 1 to 12 carbons, such as chloromethyl groups and 3,3,3-trifluoropropyl groups, and are preferably methyl groups or phenyl groups.

Examples of this type of component (B) include copolymers of dimethylsiloxane and methylvinylsiloxane capped at both molecular terminals with trimethylsiloxy groups, methylvinylpolysiloxanes capped at both molecular terminals with trimethylsiloxy groups, copolymers of dimethylsiloxane, methylvinylsiloxane, and methylphenylsiloxane capped at both molecular terminals with trimethylsiloxy groups, dimethylpolysiloxanes capped at both molecular terminals with dimethylvinylsiloxy groups, methylvinylpolysiloxanes capped at both molecular terminals with dimethylvinylsiloxy groups, methylphenylpolysiloxanes capped at both molecular terminals with dimethylvinylsiloxy groups, copolymers of dimethylsiloxane and methylvinylsiloxane capped at both molecular terminals with dimethylvinylsiloxy groups, copolymers of dimethylsiloxane, methylvinylsiloxane, and methylphenylsiloxane capped at both molecular terminals with dimethylvinylsiloxy groups, and mixtures of two or more of these organopolysiloxanes.

In the present composition, the content of component (B) is from 0 to 70% by mass, preferably from 0 to 50% by mass, and more preferably from 0 to 40% by mass, relative to the present composition. This is because it is possible to impart the cured product with softness, extensibility, and flexibility without increasing the gas permeability of the cured product, and also possible to improve the reliability of an optical semiconductor device prepared by using the present composition, if the content of component (B) is not more than the upper limit of the above-mentioned range.

Component (C) is a crosslinking agent for the present composition, and is an organosiloxane ($C_1$) represented by the following general formula:

$$HR^5R^6SiO(R^7_2SiO)_nSiR^5R^6H$$

an organopolysiloxane ($C_2$) which is represented by the following average unit formula:

$$(HR^5R^6SiO_{1/2})_d(HR^5_2SiO_{1/2})_e(R^7_2SiO_{2/2})_f(R^6SiO_{3/2})_g$$

or a mixture of the aforementioned components ($C_1$) and ($C_2$).

In component ($C_1$), $R^5$ are the same or different, are each an alkyl group having from 1 to 12 carbons, examples of which include the same alkyl groups as described for the aforementioned $R^2$, and are preferably methyl groups. In addition, $R^6$ are the same or different, and are each an aryl group having from 6 to 20 carbons or an aralkyl group having from 7 to 20 carbons. Examples of the aryl groups of $R^6$ include the same aryl groups described for the aforementioned $R^2$, and the aryl groups are preferably phenyl groups or naphthyl groups. In addition, examples of the aralkyl groups of $R^6$ include the same aralkyl groups described for the aforementioned $R^2$. In addition, $R^7$ are the same or different, and are each an alkyl group having from 1 to 12 carbons or a phenyl group. Examples of the alkyl groups of $R^7$ include the same alkyl groups described for the aforementioned $R^2$. Of these, methyl groups are preferable. In addition, n is a number from 0 to 100 and, in order for the composition to exhibit excellent handling/workability, is preferably a number from 0 to 30, and more preferably a number from 0 to 10. In addition, in order to improve the handling/workability of the composition and reduce the gas permeability of the cured product, it is preferable for n to be a number from 1 to 10 and for at least one $R^7$ in a molecule to be a phenyl group.

With regard to this type of component ($C_1$), an example of a method for preparing an organosiloxane in which n in the above-mentioned general formula is 1 or higher is to subject a silane compound (III-1) represented by the following general formula:

$$R^7_2SiX_2$$

a cyclic siloxane compound (III-2) represented by the following general formula:

$$(R^7_2SiO)_m$$

or a straight chain organopolysiloxane (III-3) represented by the following general formula:

$$HO(R^7_2SiO)_{n'}R^7_2SiOH$$

and a disiloxane (IV-1) represented by the following general formula:

$$HR^5R^6SiOSiR^5R^6H$$

and/or a silane compound (IV-2) represented by the following general formula:

$$HR^5R^6SiX$$

to a hydrolysis and condensation reaction in the presence of an acid or an alkali.

In the formula, $R^5$ is an alkyl group having from 1 to 12 carbons, and examples thereof are the same as the groups described above. In addition, $R^6$ is an aryl group having from 6 to 20 carbons or an aralkyl group having from 7 to 20 carbons, and examples thereof are the same as the groups described above. In addition, $R^7$ are the same or different, are each an alkyl group having from 1 to 12 carbons or a phenyl group, and examples thereof are the same as the groups described above. Moreover, in the formula, X is an alkoxy group, an acyloxy group, a halogen atom, or a hydroxyl group, and examples thereof are the same as the groups described above. In addition, m is a number from 3 to 20 and n' is a number from 1 to 100.

Examples of this type of component (III-1) include alkoxysilanes such as phenylmethyldimethoxysilane, diphenyldimethoxysilane, dimethyldimethoxysilane, diethyldimethoxysilane, phenylmethyldiethoxysilane, diphenyldiethoxysilane, dimethyldiethoxysilane, and diethyldiethoxysilane; halosilanes such as diphenyldichlorosilane, dimethyldichlorosilane, and diethyldichlorosilane; and hydroxysilanes such as diphenyldihydroxysilane, dimethyldihydroxysilane, and diethyldihydroxysilane.

In addition, examples of this type of cyclic siloxane compound (III-2) include cyclic dimethylsiloxanes, cyclic phenylmethylsiloxanes and cyclic diphenylsiloxanes.

In addition, examples of this type of straight chain organopolysiloxane (III-3) include dimethylpolysiloxanes capped at both molecular terminals with silanol groups, phenylmethylpolysiloxanes capped at both molecular terminals with silanol groups, and diphenylpolysiloxanes capped at both molecular terminals with silanol groups.

In addition, examples of this type of disiloxane (IV-1) include 1,3-diphenyl-1,3-dimethyldisiloxane, 1,3-dinaphthyl-1,3-dimethyldisiloxane, and 1,3-dianthracenyl-1,3-dimethyldisiloxane.

In addition, examples of this type of silane compound (IV-2) include alkoxysilanes such as methylphenylmethoxysilane, methylnaphthylmethoxysilane, anthracenylmethylmethoxysilane, methylphenylethoxysilane, methylnaphthylethoxysilane, and anthracenylmethylethoxysilane; acetoxysilanes such as methylphenylacetoxysilane, methylnaphthylacetoxysilane, and anthracenylmethylacetoxysilane; chlorosilanes such as methylphenylchlorosilane, methylnaphthylchlorosilane, and anthracenylmethylchlorosilane; and hydroxysilanes such as methylphenylhydroxysilane, methylnaphthylhydroxysilane, and anthracenylmethylhydroxysilane.

Acids that may be used are exemplified by hydrochloric acid, acetic acid, formic acid, nitric acid, oxalic acid, sulfuric acid, phosphoric acid, polyphosphoric acid, polycarboxylic acid, trifluoromethane sulfonic acid, and ion exchange resins.

Examples of alkalis able to be used include hydroxides such as sodium hydroxide and potassium hydroxide; oxides such as magnesium oxide and calcium oxide; and hydrogen halide scavengers such as triethylamine, diethylamine, ammonia, picoline, pyridine, and 1,8-bis(dimethylamino)naphthalene.

Furthermore, an organic solvent may be used in the preparation method. Examples of organic solvents able to be used include aromatic hydrocarbons, aliphatic hydrocarbons, and mixtures of 2 or more types thereof. Examples of preferred organic solvents include toluene and xylene.

In order to accelerate the hydrolysis and condensation reaction of each of the components in the preparation method, water or a mixed solution of water and alcohol is preferably added. Methanol and ethanol are preferred examples of the alcohol. If an organic solvent is used and this reaction is promoted by heating, the reaction is preferably performed at the reflux temperature of the organic solvent.

Examples of this type of component $(C_1)$ include organosiloxanes such as those mentioned below. Moreover, Me, Ph, and Naph in the formulae below denote a methyl group, a phenyl group, and a naphthyl group respectively, n' is a number from 1 to 100, n" and n''' are each numbers of 1 or higher, and n"+n''' is a number of 100 or lower.

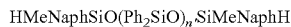

HMeNaphSiO(Ph$_2$SiO)$_{n'}$SiMeNaphH

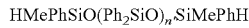

HMePhSiO(Ph$_2$SiO)$_{n'}$SiMePhH

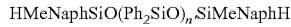

HMeNaphSiO(Ph$_2$SiO)$_{n'}$SiMeNaphH

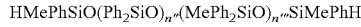

HMePhSiO(Ph$_2$SiO)$_{n''}$(MePh$_2$SiO)$_{n'''}$SiMePhH

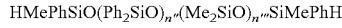

HMePhSiO(Ph$_2$SiO)$_{n''}$(Me$_2$SiO)$_{n'''}$SiMePhH

In addition, in component $(C_2)$, $R^5$ are the same or different, are each an alkyl group having from 1 to 12 carbons, and examples thereof are the same as the groups described above. In addition, $R^6$ are the same or different, are each an aryl group having from 6 to 20 carbons or an aralkyl group having from 7 to 20 carbons, and examples thereof are the same as the groups described above. In addition, $R^7$ are the same or different, are each an alkyl group having from 1 to 12 carbons or a phenyl group, and examples thereof are the same as the groups described above. In addition, d, e, f, and g are numbers that satisfy the following conditions: $0.1 \leq d \leq 0.7$, $0 \leq e \leq 0.5$, $0 \leq f \leq 0.7$, $0.1 \leq g < 0.9$, and $d+e+f+g=1$, and are preferably numbers that satisfy the following conditions: $0.2 \leq d \leq 0.7$, $0 \leq e \leq 0.4$, $0 \leq f < 0.5$, $0.25 \leq g \leq 0.7$, and $d+e+f+g=1$. This is because the gas permeability of the cured product is reduced if d is not less than the lower limit of the above-mentioned range, and the cured product has an appropriate hardness if d is not more than the upper limit of the above-mentioned range. In addition, the refractive index of the cured product is improved if e is not more than the upper limit of the above-mentioned range. In addition, the cured product has an appropriate hardness and the reliability of an optical semiconductor device prepared using the present composition is improved if f is not more than the upper limit of the above-mentioned range. In addition, the refractive index of the cured product is increased if g is not less than the lower limit of the above-mentioned range, and the mechanical strength of the cured product is improved if g is not more than the upper limit of the above-mentioned range.

The molecular weight of this type of component $(C_2)$ is not particularly limited, but from the perspectives of the handling/workability of the composition and the mechanical strength of the cured product, the mass average molecular weight in terms of standard polystyrene, as measured by gel permeation chromatography, is preferably from 500 to 10,000, and more preferably from 500 to 2,000.

An example of a method for preparing this type of organopolysiloxane of component $(C_2)$ is to subject a silane compound (V) represented by the following general formula:

$R^6SiX_3$ and the disiloxane (IV-1) represented by the following general formula:

HR$^5$R$^6$SiOSiR$^5$R$^6$H and/or the silane compound (IV-2) represented by the following general formula:

HR$^5$R$^6$SiX to a hydrolysis and condensation reaction in the presence of an acid.

In the formula, $R^5$ is an alkyl group having from 1 to 12 carbons, and examples thereof are the same as the groups described above. In addition, $R^6$ is an aryl group having from 6 to 20 carbons or an aralkyl group having from 7 to 20 carbons, and examples thereof are the same as the groups described above. Moreover, in the formula, X is an alkoxy group, an acyloxy group, a halogen atom, or a hydroxyl group; and examples thereof are the same as the groups described above.

Examples of this type of silane compound (V) include alkoxysilanes such as phenyltrimethoxysilane, naphthyltrimethoxysilane, anthracenyltrimethoxysilane, phenanthryltrimethoxysilane, pyrenyltrimethoxysilane, phenyltriethoxysilane, naphthyltriethoxysilane, anthracenyltriethoxysilane, phenanthryltriethoxysilane, and pyrenyltriethoxysilane; acyloxysilanes such as phenyltriacetoxysilane, naphthyltriacetoxysilane, anthracenyltriacetoxysilane, phenanthryltriacetoxysilane, and pyrenyltriacetoxysilane; halosilanes such as phenyltrichlorosilane, naphthyltrichlorosilane, anthracenyltrichlorosilane, phenanthryltrichlorosilane, and pyrenyltrichlorosilane; and hydroxysilanes such as phenyltrihydroxysilane, naphthyltrihydroxysilane, anthracenyltrihydroxysilane, phenanthryltrihydroxysilane, and pyrenyltrihydroxysilane.

In addition, examples of this type of disiloxane (IV-1) include the same disiloxanes described above. Examples of this type of silane compound (IV-2) are the same as the silane compounds described above.

In the above-mentioned preparation method, if necessary, a disiloxane (VI-1) represented by the following general formula:

$$HR^5{}_2SiOSiR^5{}_2H$$

and/or a silane compound (VI-2) represented by the following general formula:

$$HR^5{}_2SiX$$

can be reacted with each other. In the formula, $R^5$ is an alkyl group having from 1 to 12 carbons, and examples thereof are the same as the groups described above.

In addition, examples of this type of disiloxane (VI-1) include 1,1,3,3-tetramethyldisiloxane.

In addition, examples of this type of silane compound (VI-2) include dimethylmethoxysilane, dimethylethoxysilane, dimethylacetoxysilane, and dimethylchlorosilane.

In the above-mentioned preparation method, a silane compound represented by the following general formula:

$$R^5{}_3SiX$$

a silane compound represented by the following general formula:

$$R^5{}_2R^6SiX$$

a silane compound represented by the following general formula:

$$R^5R^6{}_2SiX$$

a silane compound represented by the following general formula:

$$R^6{}_3SiX$$

or a silane compound represented by the following general formula:

$$SiX_3$$

can be reacted with each other if necessary. In the formula, $R^5$ is an alkyl group having from 1 to 12 carbons, and examples thereof are the same as the groups described above. In addition, $R^6$ is an aryl group having from 6 to 20 carbons or an aralkyl group having from 7 to 20 carbons, and examples thereof are the same as the groups described above.

Examples of this type of silane compound include alkoxysilanes such as trimethylmethoxysilane, trimethylethoxysilane, methyldiphenylmethoxysilane, methyldiphenylethoxysilane, tetramethoxysilane, and tetraethoxysilane; acetoxysilanes such as trimethylacetoxysilane, methyldiphenylacetoxysilane, dimethylphenylacetoxysilane, and tetraacetoxysilane; halosilanes such as trimethylchlorosilane, methyldiphenylchlorosilane, dimethylphenylchlorosilane, and tetrachlorosilane; and hydroxysilanes such as trimethylhydroxysilane, methyldiphenylhydroxysilane, and dimethylphenylhydroxysilane.

In the above-mentioned preparation method, the silane compound (V), the disiloxane (IV-1), and/or the silane compound (IV-2) and, if necessary, the disiloxane (VII-1) and/or the silane compound (VII-2), and, if necessary, other silane compounds are subjected to a hydrolysis and condensation reaction in the presence of an acid.

Acids that may be used are exemplified by hydrochloric acid, acetic acid, formic acid, nitric acid, oxalic acid, sulfuric acid, phosphoric acid, polyphosphoric acid, polycarboxylic acid, trifluoromethane sulfonic acid, and ion exchange resins.

Furthermore, an organic solvent may be used in the preparation method. Examples of organic solvents able to be used include aromatic hydrocarbons, aliphatic hydrocarbons and mixtures of two or more types thereof. Examples of preferred organic solvents include toluene and xylene.

In order to accelerate the hydrolysis and condensation reaction of each of the components in the preparation method, water or a mixed solution of water and alcohol is preferably added. Methanol and ethanol are preferred examples of the alcohol. If an organic solvent is used and this reaction is promoted by heating, the reaction is preferably performed at the reflux temperature of the organic solvent.

Examples of this type of component ($C_2$) include organopolysiloxanes such as those mentioned below. Moreover, Me, Ph, and Naph in the formulae below denote a methyl group, a phenyl group, and a naphthyl group respectively, and d, e', f', and g are numbers that satisfy the following conditions: $0.1 \leq d \leq 0.7$, $0 \leq e' \leq 0.5$, $0 < f' \leq 0.7$, $0.1 \leq g < 0.9$, and $d+e'+f'+g=1$.

$$(HMePhSiO_{1/2})_d(PhSiO_{3/2})_g$$

$$(HMePhSiO_{1/2})_d(NaphSiO_{3/2})_g$$

$$(HMePhSiO_{1/2})_d(HMe_2SiO_{1/2})_e(PhSiO_{3/2})_g$$

$$(HMePhSiO_{1/2})_d(Ph_2SiO_{4/2})_{f'}(PhSiO_{3/2})_g$$

$$(HMePhSiO_{1/2})_d(Ph_2SiO_{4/2})_{f'}(NaphSiO_{3/2})_g$$

$$(HMePhSiO_{1/2})_d(HMe_2SiO_{1/2})_e(NaphSiO_{3/2})_g$$

$$(HMePhSiO_{1/2})_d(HMe_2SiO_{1/2})_e(Ph_2SiO_{2/2})_{f'}(NaphSiO_{3/2})_g$$

$$(HMePhSiO_{1/2})_d(HMe_2SiO_{1/2})_e(Ph_2SiO_{2/2})_{f'}(PhSiO_{3/2})_g$$

Component (C) can be the above-mentioned component ($C_1$), the above-mentioned component ($C_2$), or a mixture of the above-mentioned component ($C_1$) and the above-mentioned component ($C_2$). In cases where a mixture of the above-mentioned component ($C_1$) and the above-mentioned component ($C_2$) is used, the mixing ratio is not particularly limited, but it is preferable for the ratio of mass of the above-mentioned component ($C_1$): mass of the above-mentioned component ($C_2$) to be from 0.5:9.5 to 9.5:0.5.

The content of component (C) in the present composition, per 1 mol of total alkenyl groups in components (A) and (B), is in a range such that the silicon-bonded hydrogen atoms in component (C) is in a range from 0.1 to 5 mol, and preferably in a range from 0.5 to 2 mol. This is because the composition can be satisfactorily cured if the content of component (C) is not less than the lower limit of the above-mentioned range and the heat resistance of the cured product is improved and the reliability of an optical semiconductor device prepared using the present composition is improved if the content of component (C) is not more than the upper limit of the above-mentioned range.

In addition, component (D) is a hydrosilylation reaction catalyst used to facilitate curing of the present composition, and examples of component (D) include platinum-based catalysts, rhodium-based catalysts, and palladium-based catalysts. Component (D) is preferably a platinum-based catalyst so that the curing of the present composition can be dramatically accelerated. Examples of the platinum-based catalyst include a platinum fine powder, chloroplatinic acid, an alcohol solution of chloroplatinic acid, a platinum-alkenylsiloxane complex, a platinum-olefin complex and a platinum-carbonyl complex, with a platinum-alkenylsiloxane complex being preferred.

In addition, the content of component (D) in the present composition is an effective quantity for facilitating curing of the present composition. Specifically, in order to satisfactorily cure the present composition, the content of component (D) is preferably a quantity whereby the content of catalytic metal in component (D) relative to the present composition is from 0.01 to 500 ppm, more preferably from 0.01 to 100 ppm, and particularly preferably from 0.01 to 50 ppm, in terms of mass units.

In order to improve adhesion of the cured product to a base material being contacted during curing, the present composition may contain (E) an adhesion-imparting agent. Preferred components (E) are organosilicon compounds having at least one alkoxy group bonded to a silicon atom in a molecule. This alkoxy group is exemplified by a methoxy group, an ethoxy group, a propoxy group, a butoxy group, and a methoxyethoxy group; and the methoxy group is particularly preferred. Moreover, non-alkoxy groups bonded to a silicon atom of this organosilicon compound are exemplified by substituted or non-substituted monovalent hydrocarbon groups such as alkyl groups, alkenyl groups, aryl groups, aralkyl groups, halogenated alkyl groups and the like; epoxy group-containing monovalent organic groups such as a 3-glycidoxypropyl group, a 4-glycidoxybutyl group, or similar glycidoxyalkyl groups; a 2-(3,4-epoxycyclohexyl)ethyl group, a 3-(3,4-epoxycyclohexyl)propyl group, or similar epoxycyclohexylalkyl groups; and a 4-oxiranylbutyl group, an 8-oxiranyloctyl group, or similar oxiranylalkyl groups; acrylic group-containing monovalent organic groups such as a 3-methacryloxypropyl group and the like; and a hydrogen atom. This organosilicon compound preferably has a silicon-bonded alkenyl group or silicon-bonded hydrogen atom. Moreover, due to the ability to impart good adhesion with respect to various types of base materials, this organosilicon compound preferably has at least one epoxy group-containing monovalent organic group in a molecule. This type of organosilicon compound is exemplified by organosilane compounds, organosiloxane oligomers and alkyl silicates. Molecular structure of the organosiloxane oligomer or alkyl silicate is exemplified by a linear chain structure, partially branched linear chain structure, branched chain structure, ring-shaped structure, and net-shaped structure. A linear chain structure, branched chain structure, and net-shaped structure are particularly preferred. This type of organosilicon compound is exemplified by silane compounds such as 3-glycidoxypropyltrimethoxysilane, 2-(3,4-epoxycyclohexyl)ethyltrimethoxysilane, 3-methacryloxy propyltrimethoxysilane, and the like; siloxane compounds having at least one silicon-bonded alkenyl group or silicon-bonded hydrogen atom, and at least one silicon-bonded alkoxy group in a molecule; mixtures of a silane compound or siloxane compound having at least one silicon-bonded alkoxy group and a siloxane compound having at least one silicon-bonded hydroxyl group and at least one silicon-bonded alkenyl group in the molecule; and methyl polysilicate, ethyl polysilicate, and epoxy group-containing ethyl polysilicate. In the present composition, the content of component (E) is not particularly limited, but in order to achieve good adhesion to a base material being contacted during curing, the content of component (E) is preferably from 0.01 to 10 parts by mass per 100 parts total mass of components (A) to (D).

The present composition may contain an organohydrogenpolysiloxane other than component (C) as long as the objective of the present invention is not impaired. This type of organohydrogenpolysiloxane is exemplified by a methylhydrogenpolysiloxane capped at both molecular terminals with trimethylsiloxy groups, a copolymer of dimethylsiloxane and methylhydrogensiloxane capped at both molecular terminals with trimethylsiloxy groups, a copolymer of dimethylsiloxane, methylhydrogensiloxane, and methylphenylsiloxane capped at both molecular terminals with trimethylsiloxy groups, a dimethylpolysiloxane capped at both molecular terminals with dimethylhydrogensiloxy groups, a copolymer of dimethylsiloxane and methylphenylsiloxane capped at both molecular terminals with dimethylhydrogensiloxy groups, a methylphenylpolysiloxane capped at both molecular terminals with dimethylhydrogensiloxy groups, organopolysiloxane copolymers composed of siloxane units represented by the general formula $R'_3SiO_{1/2}$, siloxane units represented by the general formula $R'_2HSiO_{1/2}$ and siloxane units represented by the formula $SiO_{4/2}$, organopolysiloxane copolymers composed of siloxane units represented by the general formula $R'_2HSiO_{1/2}$ and siloxane units represented by the formula $SiO_{4/2}$, organopolysiloxane copolymers composed of siloxane units represented by the general formula $R'HSiO_{2/2}$ and siloxane units represented by the general formula $R'SiO_{3/2}$ or siloxane units represented by the formula $HSiO_{3/2}$, and mixtures of two or more such organopolysiloxanes. Moreover, R' is an alkyl group having from 1 to 12 carbons, an aryl group having from 6 to 20 carbons, an aralkyl group having from 7 to 20 carbons, or a halogenated alkyl group having from 1 to 12 carbons. Examples of the alkyl group of R' include methyl groups, ethyl groups, propyl groups, butyl groups, pentyl groups, hexyl groups, heptyl groups, octyl groups, nonyl groups, decyl groups, undecyl groups, and dodecyl groups. In addition, examples of the aryl group of R' include phenyl groups, tolyl groups, xylyl groups, naphthyl groups, anthracenyl groups, phenanthryl groups, pyrenyl groups, and groups obtained by substituting hydrogen atoms in these aryl groups with alkyl groups such as methyl groups or ethyl groups; alkoxy groups such as methoxy groups or ethoxy groups; and halogen atoms such as chlorine atoms or bromine atoms. In addition, examples of the aralkyl group of R' include benzyl groups, phenethyl groups, naphthyl ethyl groups, naphthyl propyl groups, anthracenyl ethyl groups, phenanthryl ethyl groups, pyrenyl ethyl groups, and groups obtained by substituting hydrogen atoms in these aralkyl groups with alkyl groups such as methyl groups or ethyl groups; alkoxy groups such as methoxy groups or ethoxy groups; and halogen atoms such as chlorine atoms or bromine atoms. In addition, examples of the halogenated alkyl group of R' include chloromethyl groups and 3,3,3-trifluoropropyl groups.

A reaction inhibitor, for example, an alkyne alcohol such as 2-methyl-3-butyn-2-ol, 3,5-dimethyl-1-hexyn-3-ol, or 2-phenyl-3-butyn-2-ol; an ene-yne compound such as 3-methyl-3-penten-1-yne or 3,5-dimethyl-3-hexen-1-yne; or 1,3,5,7-tetramethyl-1,3,5,7-tetravinylcyclotetrasiloxane, 1,3,5,7-tetramethyl-1,3,5,7-tetrahexenylcyclotetrasiloxane, or a benzotriazole may be incorporated as an optional component in the present composition. The content of the reaction inhibitor in the present composition is not particularly limited, but is preferably from 0.0001 to 5 parts by mass per 100 parts total mass of the above-mentioned components (A) to (D).

Moreover, the present composition may include as an additional optional component a phosphor. This phosphor is exemplified by substances widely used in light emitting diodes (LED), such as yellow, red, green, and blue light-emitting phosphors such as oxide type phosphors, oxynitride type phosphors, nitride type phosphors, sulfide type phosphors, oxysulfide type phosphors, and the like. Examples of oxide type phosphors include yttrium, aluminum, and garnet-type YAG green to yellow light-emitting phosphors containing cerium ions; terbium, aluminum, and garnet-type TAG yellow light-emitting phosphors containing cerium ions; and silicate green to yellow light-emitting phosphors containing cerium or europium ions. Examples of oxynitride type phosphors include silicon, aluminum, oxygen, and nitrogen-type SiAlON red to green light-emitting phosphors containing europium ions. Examples of nitride type phosphors include calcium, strontium, aluminum, silicon, and nitrogen-type CASN red light-emitting phosphors containing europium ions. Examples of sulfide type phosphors include ZnS green light-emitting phosphors containing copper ions or aluminum ions. Examples of oxysulfide type phosphors include $Y_2O_2S$ red light-emitting phosphors containing europium ions. These phosphors may be used as one type or as a mixture of two or more types. The content of this phosphor in the present composition is not particularly limited, but is preferably from 0.1 to 70% by mass, and more preferably from 1 to 20% by mass, relative to the present composition.

An inorganic filler such as silica, glass, alumina, or zinc oxide; an organic resin fine powder of a polymethacrylate resin and the like; a heat-resistant agent, a dye, a pigment, a flame retardant, a solvent, and the like may be incorporated as optional components in the present composition at levels that do not impair the objective of the present invention.

The present composition is such that curing occurs either at room temperature or under heating, but it is preferable to heat the composition in order to achieve rapid curing. The heating temperature is preferably from 50 to 200° C.

The cured product of the present invention will now be described in detail.

The cured product of the present invention is formed by curing the aforementioned curable silicone composition. The form of the cured product is not particularly limited, and can be in the form of, for example, a sheet or film. The cured product can be handled alone but can also be handled in a state whereby the cured product covers or seals an optical semiconductor element.

The optical semiconductor device of the present invention will now be described in detail.

The optical semiconductor device of the present invention is characterized in that an optical semiconductor element is sealed by a cured product of the above-mentioned curable silicone composition. Examples of the optical semiconductor device of the present invention include light emitting diodes (LEDs), photocouplers, and CCDs. In addition, examples of optical semiconductor elements include light emitting diode (LED) chips and solid-state image sensing devices.

FIG. 1 is a cross-sectional drawing of a single surface mounted type LED, which is an example of the optical semiconductor device of the present invention. In the LED illustrated in FIG. 1, an LED chip 1 is die-bonded to a lead frame 2, and the LED chip 1 and a lead frame 3 are wire-bonded by a bonding wire 4. A frame material 5 is provided around the periphery of this LED chip 1, and the LED chip 1 on the inner side of this frame material 5 is sealed by a cured product 6 of the curable silicone composition of the present invention.

An example of a method for producing the surface mounted type LED illustrated in FIG. 1 is a method comprising die-bonding the LED chip 1 to the lead frame 2, wire-bonding this LED chip 1 and the lead frame 3 by means of metal bonding wire 4, filling inside the frame material 5 provided around the LED chip 1 with the curable silicone composition of the present invention, and then curing the curable silicone composition by heating to 50 to 200° C.

EXAMPLES

The curable silicone composition, a cured product thereof and an optical semiconductor device of the present invention will now be described using examples. The viscosity is the value at 25° C. Moreover, in the practical examples, Me, Vi, Ph, Naph, and Ep denote a methyl group, a vinyl group, a phenyl group, a naphthyl group, and a 3-glycidoxypropyl group, respectively. The characteristics of the cured product of the curable silicone composition were measured as follows.

[Refractive Index of Cured Product]

A cured product is produced by heating the curable silicone composition at 150° C. for 2 hours in a circulating hot air oven. The refractive index of this cured product at 25° C. and a wavelength of 633 nm was measured using a refractometer.

[Water Vapor Permeability of Cured Product]

Using a press, the curable silicone composition was cured at 150° C. for 2 hours to produce a cured film having a thickness of 1 mm. The water vapor permeability of this cured film was measured at a temperature of 40° C. and a relative humidity of 90% in accordance with the cup method of JIS Z 0208.

REFERENCE EXAMPLE 1

82.2 g of 1,3-divinyl-1,1,3,3-tetramethyldisiloxane, 143 g of water, 0.38 g of trifluoromethane sulfonic acid, and 500 g of toluene were placed in a 4 neck flask fitted with a stirrer, a refluxing cooler, and a thermometer, and 524.7 g of phenyltrimethoxysilane was added dropwise to the flask under stirring over a period of 1 hour. Following completion of the dropwise addition, the contents of the flask were heated to reflux for 1 hour. The flask was then cooled, the lower layer was separated, and the toluene solution layer was washed 3 times with water. 314 g of methylglycidoxypropyldimethoxysilane, 130 g of water, and 0.50 g of potassium hydroxide were added to the washed toluene solution layer and heated to reflux for 1 hour. Next, methanol was distilled off and excess water was removed by azeotropic dehydration. After heating to reflux for 4 hours, the toluene solution was cooled, neutralized with 0.55 g of acetic acid and washed 3 times with water. After removing the water, the toluene was distilled off under reduced pressure, thereby producing an adhesion-imparting agent having a viscosity of 8,500 mPa·s and represented by the following average unit formula:

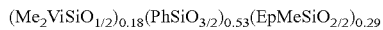

$(Me_2ViSiO_{1/2})_{0.18}(PhSiO_{3/2})_{0.53}(EpMeSiO_{2/2})_{0.29}$

REFERENCE EXAMPLE 2

400 g (2.02 moles) of phenyltrimethoxysilane and 93.5 g (0.30 moles) of 1,3-divinyl-1,3-diphenyldimethyldisiloxane were placed in a reaction vessel and mixed, after which 1.74 g (11.6 mmol) of trifluoromethane sulfonic acid was added, 110 g (6.1 moles) of water was added under stirring, and the mixture was heated to reflux for 2 hours. Next, the mixture was distilled at atmospheric pressure by heating until the temperature reached 85° C. Next, 89 g of toluene and 1.18 g (21.1 mmol) of potassium hydroxide were added, and the mixture was distilled at atmospheric pressure by heating until the reaction temperature reached 120° C. and then allowed to react at this temperature for 6 hours. The mixture was cooled down to room temperature, and then 0.68 g (11.4 mmol) of acetic acid was added to perform the neutralization reaction. The produced salt was filtered, and low boiling point substances were removed from the obtained transparent solution by heating under reduced pressure, thereby producing 347 g (yield: 98%) of an organopolysiloxane represented by the following average unit formula:

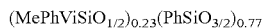

$(MePhViSiO_{1/2})_{0.23}(PhSiO_{3/2})_{0.77}$

REFERENCE EXAMPLE 3

892.8 g (3.6 moles) of 1-naphthyltrimethoxysilane and 372.0 g (1.2 moles) of 1,3-divinyl-1,3-diphenyldimethyldisiloxane were placed in a reaction vessel and mixed, after which 6.15 g (41 mmol) of trifluoromethane sulfonic acid was added, 213.84 g (11.88 moles) of water was added under stirring, and the mixture was heated to reflux for 2 hours. Next, the mixture was distilled at atmospheric pressure by heating until the temperature reached 85° C. Next, 435.6 g of toluene and 3.28 g (58.6 mmol) of potassium hydroxide were added, and the mixture was distilled at atmospheric pressure by heating until the reaction temperature reached 120° C. and then allowed to react at this temperature for 6 hours. The mixture was then cooled down to room temperature, and then 3.524 g (58.7 mmol) of acetic acid was added to perform the neutralization reaction. The produced salt was filtered, and low boiling point substances were removed from the obtained transparent solution by heating under reduced pressure, thereby producing 957.4 g (yield: 94.2%) of an organopolysiloxane represented by the following average unit formula:

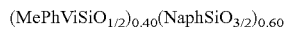

$(MePhViSiO_{1/2})_{0.40}(NaphSiO_{3/2})_{0.60}$

REFERENCE EXAMPLE 4

148.8 g (0.6 moles) of 1-naphthyltrimethoxysilane and 37.2 g (0.2 moles) of 1,3-divinyltetramethyl disiloxane were placed in a reaction vessel and mixed, after which 0.136 g (0.9 mmol) of trifluoromethane sulfonic acid was added, 35.6 g (1.98 moles) of water was added under stirring, and the mixture was heated to reflux for 2 hours. Next, the mixture was distilled at atmospheric pressure by heating until the temperature reached 85° C. Next, 62.0 g of toluene and 0.194 g (3.5 mmol) of potassium hydroxide were added, and the mixture was distilled at atmospheric pressure by heating until the reaction temperature reached 120° C. and then allowed to react at this temperature for 6 hours. The mixture was then cooled to room temperature, and a neutralization reaction was performed by adding 0.21 g (3.5 mmol) of acetic acid. The produced salt was filtered, and low boiling point substances were removed from the obtained transparent liquid by heating under reduced pressure, thereby producing 130.0 g (yield: 89.9%) of an organopolysiloxane represented by the following average unit formula:

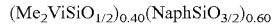

$(Me_2ViSiO_{1/2})_{0.40}(NaphSiO_{3/2})_{0.60}$

REFERENCE EXAMPLE 5

15.69 g (0.0725 moles) of diphenyldihydroxysilane, 60 g of tetrahydrofuran, 60 g of toluene, and 18.35 g (0.181 moles) of triethylamine were placed in a reaction vessel, and then a mixed solution of 25.0 g (0.159 moles) of phenylmethylchlorosilane and 20 g of toluene was added dropwise under stirring. Following completion of the dropwise addition, the mixture was stirred at room temperature for 2 hours and then heated to reflux for 1 hour. The mixture was then cooled to room temperature, 10.0 g of methanol was added, and the mixture was heated to reflux for 1 hour. The mixture was then cooled to room temperature, the produced salt was filtered, and low boiling point substances were removed by heating under reduced pressure, thereby producing 27.1 g (yield: 82.0%) of an organotrisiloxane represented by the following formula:

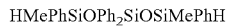

HMePhSiOPh$_2$SiOSiMePhH

REFERENCE EXAMPLE 6

61.0 g (0.25 moles) of diphenyldimethoxysilane and 0.094 g (0.625 mmol) of trifluoromethane sulfonic acid were placed in a reaction vessel and heated under stirring. While the mixture was heated to 45 to 50° C., 9 g (0.15 moles) of acetic acid was added dropwise. After completion of drop-wise addition, the mixture was heated and stirred for 30 minutes at 50° C. The mixture was heated and low boiling point substances were distilled at atmospheric pressure until the reaction temperature reached 80° C. The mixture was then cooled to room temperature, and 24.38 g (0.11 moles) of 1,3-dimethyl-1,3-diphenyldisiloxane was added dropwise and heated until the reaction temperature reached 45° C. 12 g (0.2 moles) of acetic acid was then added dropwise at 45 to 50° C. After completion of drop-wise addition, the mixture was heated and stirred for 30 minutes at 50° C. While maintaining a temperature of 60° C. or lower, 10.2 g (0.1 moles) of acetic acid anhydride was added dropwise, and after completion of drop-wise addition, the mixture was heated and stirred at 50° C. for 30 minutes. Toluene and water were then added, and after washing with water, low boiling point substances were removed from the organic layer by heating under reduced pressure, thereby producing 60.0 g (yield: 79.7%) of an organopolysiloxane represented by the following average formula:

HMePhSiO(Ph$_2$SiO)$_{2.5}$SiMePhH

REFERENCE EXAMPLE 7

29.7 g (0.15 moles) of phenyltrimethoxysilane and 0.096 g (0.64 mmol) of trifluoromethane sulfonic acid were placed in a reaction vessel. While heating under stirring at 45 to 50° C., 6.75 g (0.11 moles) of acetic acid was added dropwise, and following completion of the dropwise addition, the mixture was heated under stirring at 50° C. for 30 minutes. Low boiling point substances produced during the reaction were removed by heating to 80° C. at atmospheric pressure, the system was cooled to room temperature, and 31.93 g (0.12 moles) of 1,3-dimethyl-1,3-diphenyldisiloxane was added dropwise and heated under stirring until the temperature reached 45° C. 13.5 g (0.23 moles) of acetic acid was added dropwise at 45 to 50° C., and following completion of the dropwise addition, the mixture was heated under stirring at 50° C. for 30 minutes. 11.48 g (0.11 moles) of acetic acid anhydride was added dropwise at 50 to 60° C., and following completion of the dropwise addition, the mixture was heated under stirring at 50° C. for 30 minutes. Toluene and water were then added, and after washing with water, low boiling point substances were removed from the organic layer by heating under reduced pressure, thereby producing 38.3 g (yield: 74.7%) of an organopolysiloxane represented by the following average unit formula:

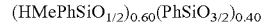

$(HMePhSiO_{1/2})_{0.60}(PhSiO_{3/2})_{0.40}$

The mass average molecular weight in terms of standard polystyrene of this organopolysiloxane (Mw) was $8.2 \times 10^2$, and the dispersity (Mw/Mn) was 1.06.

REFERENCE EXAMPLE 8

44.64 g (0.18 moles) of naphthyltrimethoxysilane and 0.339 g (2.26 mmol) of trifluoromethane sulfonic acid were placed in a reaction vessel. While heating under stirring at 45 to 50° C., 12.6 g (0.21 moles) of acetic acid was added dropwise, and following completion of the dropwise addition, the mixture was heated under stirring at 50° C. for 30 minutes. Low boiling point substances produced during the reaction were removed by heating to 70° C. at atmospheric pressure, the system was cooled to room temperature, and 17.03 g (0.066 moles) of 1,3-dimethyl-1,3-diphenyldisiloxane was added dropwise and heated under stirring until the temperature reached 45° C. 7.2 g (0.12 moles) of acetic acid was added dropwise at 45 to 50° C., and following completion of the dropwise addition, the mixture was heated under stirring at 50° C. for 30 minutes. 6.12 g (0.06 moles) of acetic acid anhydride was added dropwise at 50 to 60° C., and following completion of the dropwise addition, the mixture was heated under stirring at 50° C. for 30 minutes. Toluene and water were then added, and after repeated washing with water, low boiling point substances were removed from the organic layer by heating under reduced pressure, thereby producing 42.98 g (yield: 90.1%) of an organopolysiloxane represented by the following average unit formula:

$(HMePhSiO_{1/2})_{0.40}(NaphSiO_{3/2})_{0.60}$

The mass average molecular weight in terms of standard polystyrene of this organopolysiloxane (Mw) was $8.0 \times 10^2$, and the dispersity (Mw/Mn) was 1.03.

REFERENCE EXAMPLE 9

80.01 g (0.099 moles) of a phenylmethylpolysiloxane represented by the following formula:

$HO(MePhSiO)_6H$ 120 g of toluene and 26.8 g (0.262 moles) of triethylamine were placed in a reaction vessel, and a mixture solution of 34.1 g (0.218 moles) of phenylmethylchlorosilane and 20 g of toluene was added under stirring and stirred at room temperature for 2 hours. 4.18 g (0.131 moles) of methanol was then added, water was added, and after washing with water, low boiling point substances were removed from the organic layer by heating under reduced pressure, thereby producing 99.2 g (yield: 95.6%) of a colorless transparent liquid having a viscosity of 72.5 mPa·s and a refractive index of 1.543. This liquid was analyzed by NMR and found to be an organopolysiloxane represented by the following formula:

$HMePhSiO(MePhSiO)_6SiMePhH$

PRACTICAL EXAMPLE 1

67.8 parts by mass of an organopolysiloxane represented by the following average unit formula:

$(Me_2ViSiO_{1/2})_{0.25}(PhSiO_{3/2})_{0.75}$ 32.2 parts by mass (at an amount where the number of silicon-bonded hydrogen atoms in the present component is 1 mole relative to 1 mole of vinyl groups in the above-mentioned organopolysiloxane) of the organopolysiloxane prepared in Reference Example 5, which is represented by the following formula:

$HMePhSiOPh_2SiOSiMePhH$ 2 parts by mass of the adhesion-imparting agent prepared in Reference Example 1 and 0.25 parts by mass of a solution of a platinum-1,3-divinyl-1,1,3,3-tetramethyldisiloxane complex in 1,3,5,7-tetramethyl-1,3,5,7-tetravinylcyclotetrasiloxane (the solution containing 0.1% by mass of platinum) were mixed, thereby producing a curable silicone composition having a viscosity of 2.1 Pa·s. The refractive index and water vapor permeability of a cured product of this curable silicone composition were evaluated. These results are shown in Table 1.

The optical semiconductor device illustrated in FIG. 1 was produced by heating the above-mentioned curable silicone composition at 150° C. for 2 hours. This optical semiconductor device was subjected to an exposure test for 24 hours at 50° C., a relative humidity of 75%, and a hydrogen sulfide gas concentration of 20 ppm. When changes in the luminous efficiency of the optical semiconductor device before and after the exposure test were measured, no changes were observed.

PRACTICAL EXAMPLE 2

67.8 parts by mass of the organopolysiloxane prepared in Reference Example 2, which is represented by the following average unit formula:

$(MePhViSiO_{1/2})_{0.23}(PhSiO_{3/2})_{0.77}$ 32.2 parts by mass (at an amount where the number of silicon-bonded hydrogen atoms in the present component is 1 mole relative to 1 mole of vinyl groups in the above-mentioned organopolysiloxane) of the organopolysiloxane prepared in Reference Example 5, which is represented by the following formula:

$HMePhSiOPh_2SiOSiMePhH$ and 0.25 parts by mass of a solution of a platinum-divinyl-1,1,3,3-tetramethyldisiloxane complex in 1,3,5,7-tetramethyl-1,3,5,7-tetravinylcyclotetrasiloxane (the solution containing 0.1% by mass of platinum) were mixed, thereby producing a curable silicone composition having a viscosity of 2.7 Pa·s. The refractive index and water vapor permeability of a cured product of this curable silicone composition were evaluated. These results are shown in Table 1.

PRACTICAL EXAMPLE 3

63.0 parts by mass of the organopolysiloxane represented by the following average unit formula:

$(Me_2ViSiO_{1/2})_{0.25}(PhSiO_{3/2})_{0.75}$ 37.0 parts by mass (at an amount where the number of silicon-bonded hydrogen atoms in the present component is 1 mole relative to 1 mole of vinyl groups in the above-mentioned organopolysiloxane) of the organopolysiloxane prepared in Reference Example 7, which is represented by the following average unit formula:

$(HMePhSiO_{1/2})_{0.60}(PhSiO_{3/2})_{0.40}$ and 0.25 parts by mass of a solution of a platinum-1-,3-divinyl-1,1,3,3-tetramethyldisiloxane complex in 1,3,5,7-tetramethyl-1,3,5,7-tetravinylcyclotetrasiloxane (the solution containing 0.1% by mass of platinum) were mixed, thereby producing a curable silicone composition having a viscosity of 0.9 Pa·s. The refractive index and water vapor permeability of a cured product of this curable silicone composition were evaluated. These results are shown in Table 1.

PRACTICAL EXAMPLE 4

46.0 parts by mass of an organopolysiloxane represented by the following average unit formula:

$(Me_2ViSiO_{1/2})_{0.25}(PhSiO_{3/2})_{0.75}$ 15.0 parts by mass of a methylphenylpolysiloxane capped at both molecular terminals with dimethylvinylsiloxy groups and having a viscosity of 3,000 mPa·s, 34.0 parts by mass (at an amount where the number of silicon-bonded hydrogen atoms in the present component is 0.83 moles relative to 1 mole of vinyl groups in the above-mentioned organopolysiloxane and the above-mentioned methylphenylpolysiloxane) of the organopolysiloxane prepared in Reference Example 6, which is represented by the following average formula:

HMePhSiO(Ph$_2$SiO)$_{2.5}$SiMePhH 5.0 parts by mass (at an amount where the number of silicon-bonded hydrogen atoms in the present component is 0.17 moles relative to 1 mole of vinyl groups in the above-mentioned organopolysiloxane and the above-mentioned methylphenylpolysiloxane) of the organopolysiloxane prepared in Reference Example 7, which is represented by the following average unit formula:

(HMePhSiO$_{1/2}$)$_{0.60}$(PhSiO$_{3/2}$)$_{0.40}$ and 0.25 parts by mass of a solution of a platinum-1,3-divinyl-1,1,3,3-tetramethyldisiloxane complex in 1,3,5,7-tetramethyl-1,3,5,7-tetravinylcyclotetrasiloxane (the solution containing 0.1% by mass of platinum) were mixed, thereby producing a curable silicone composition having a viscosity of 3.2 Pa·s. The refractive index and water vapor permeability of a cured product of this curable silicone composition were evaluated. These results are shown in Table 1.

PRACTICAL EXAMPLE 5

78.0 parts by mass of an organopolysiloxane represented by the following average unit formula:

(Me$_2$ViSiO$_{1/2}$)$_{0.25}$(PhSiO$_{3/2}$)$_{0.75}$ 22.0 parts by mass (at an amount where the number of silicon-bonded hydrogen atoms in the present component is 1 mole relative to 1 mole of vinyl groups in the above-mentioned organopolysiloxane) of an organodisiloxane represented by the following formula:

HMePhSiOSiMePhH and 0.25 parts by mass of a solution of a platinum-1,3-divinyl-1,1,3,3-tetramethyldisiloxane complex in 1,3,5,7-tetramethyl-1,3,5,7-tetravinylcyclotetrasiloxane (the solution containing 0.1% by mass of platinum) were mixed, thereby producing a curable silicone composition having a viscosity of 1.1 Pa·s. The refractive index and water vapor permeability of a cured product of this curable silicone composition were evaluated. These results are shown in Table 1.

COMPARATIVE EXAMPLE 1

73.4 parts by mass of an organopolysiloxane represented by the following average unit formula:

(Me$_2$ViSiO$_{1/2}$)$_{0.25}$(PhSiO$_{3/2}$)$_{0.75}$ 26.6 parts by mass (at an amount where the number of silicon-bonded hydrogen atoms in the present component is 1 mole relative to 1 mole of vinyl groups in the above-mentioned organopolysiloxane) of an organotrisiloxane represented by the following formula:

HMe$_2$SiOPh$_2$SiOSiMe$_2$H 2 parts by mass of the adhesion-imparting agent prepared in Reference Example 1 and 0.25 parts by mass of a solution of a platinum-1,3-divinyl-1,1,3,3-tetramethyldisiloxane complex in 1,3,5,7-tetramethyl-1,3,5,7-tetravinylcyclotetrasiloxane (the solution containing 0.1% by mass of platinum) were mixed, thereby producing a curable silicone composition having a viscosity of 2.3 Pa·s. The refractive index and water vapor permeability of a cured product of this curable silicone composition were evaluated. These results are shown in Table 1.

The optical semiconductor device illustrated in FIG. 1 was produced by heating the above-mentioned curable silicone composition at 150° C. for 2 hours. This optical semiconductor device was subjected to an exposure test for 24 hours at 50° C., a relative humidity of 75%, and a hydrogen sulfide gas concentration of 20 ppm. The luminous efficiency following the exposure test was approximately 6% lower than the luminous efficiency before the exposure test.

COMPARATIVE EXAMPLE 2

76.6 parts by mass of the organopolysiloxane prepared in Reference Example 2, which is represented by the following average unit formula:

(MePhViSiO$_{1/2}$)$_{0.23}$(PhSiO$_{3/2}$)$_{0.77}$ 23.4 parts by mass (at an amount where the number of silicon-bonded hydrogen atoms in the present component is 1 mole relative to 1 mole of vinyl groups in the above-mentioned organopolysiloxane) of an organotrisiloxane represented by the following formula:

HMe$_2$SiOPh$_2$SiOSiMe$_2$H and 0.25 parts by mass of a solution of a platinum-1,3-divinyl-1,1,3,3-tetramethyldisiloxane complex in 1,3,5,7-tetramethyl-1,3,5,7-tetravinylcyclotetrasiloxane (the solution containing 0.1% by mass of platinum) were mixed, thereby producing a curable silicone composition having a viscosity of 4.6 Pa·s. The refractive index and water vapor permeability of a cured product of this curable silicone composition were evaluated. These results are shown in Table 1.

COMPARATIVE EXAMPLE 3

75.0 parts by mass of an organopolysiloxane represented by the following average unit formula:

(Me$_2$ViSiO$_{1/2}$)$_{0.25}$(PhSiO$_{3/2}$)$_{0.75}$ 25.0 parts by mass (at an amount where the number of silicon-bonded hydrogen atoms in the present component is 1 mole relative to 1 mole of vinyl groups in the above-mentioned organopolysiloxane) of an organopolysiloxane represented by the following average unit formula:

(HMe$_2$SiO$_{1/2}$)$_{0.60}$(PhSiO$_{3/2}$)$_{0.40}$ and 0.25 parts by mass of a solution of a platinum-1,3-divinyl-1,1,3,3-tetramethyldisiloxane complex in 1,3,5,7-tetramethyl-1,3,5,7-tetravinylcyclotetrasiloxane (the solution containing 0.1% by mass of platinum) were mixed, thereby producing a curable silicone composition having a viscosity of 140 Pa·s. The refractive index and water vapor permeability of a cured product of this curable silicone composition were evaluated. These results are shown in Table 1.

COMPARATIVE EXAMPLE 4

24.0 parts by mass of an organopolysiloxane represented by the following average unit formula:

(Me$_2$ViSiO$_{1/2}$)$_{0.25}$(PhSiO$_{3/2}$)$_{0.75}$ 15.0 parts by mass of a methylphenylpolysiloxane capped at both molecular terminals with dimethylvinylsiloxy groups and having a viscosity of 3,000 mPa·s, 28.0 parts by mass (at an amount where the number of silicon-bonded hydrogen atoms in the present component is 0.70 moles relative to 1 mole of vinyl groups in the above-mentioned organopolysiloxane and the above-mentioned methylphenylpolysiloxane) of an organopolysiloxane represented by the following average formula:

HMe$_2$SiO(Ph$_2$SiO)$_{2.5}$SiMe$_2$H 5.0 parts by mass (at an amount where the number of silicon-bonded hydrogen atoms in the present component is 0.30 moles relative to 1 mole of vinyl groups in the above-mentioned organopolysiloxane and the above-mentioned methylphenylpolysiloxane) of an organopolysiloxane represented by the following average unit formula:

(HMe$_2$SiO$_{1/2}$)$_{0.60}$(PhSiO$_{3/2}$)$_{0.40}$ and 0.25 parts by mass of a solution of a platinum-1,3-divinyl-1,1,3,3-tetramethyldisiloxane complex in 1,3,5,7-tetramethyl-1,3,5,7-tetravinylcyclotetrasiloxane (the solution containing 0.1% by mass of platinum) were mixed, thereby producing a curable silicone composition having a viscosity of 7.3 Pa·s. The refractive index and water vapor permeability of a cured product of this curable silicone composition were evaluated. These results are shown in Table 1.

TABLE 1

| Item | Category Present invention | | | | |
|---|---|---|---|---|---|
| | Practical Example 1 | Practical Example 2 | Practical Example 3 | Practical Example 4 | Practical Example 5 |
| Refractive index | 1.57 | 1.56 | 1.56 | 1.57 | 1.56 |
| Appearance | Transparent | Transparent | Transparent | Transparent | Transparent |
| Water vapor permeability (g/m$^2$ · 24 h) | 5.8 | 5.5 | 9.9 | 9.6 | 7.8 |

| Item | Category Comparative Examples | | | |
|---|---|---|---|---|
| | Comparative Example 1 | Comparative Example 2 | Comparative Example 3 | Comparative Example 4 |
| Refractive index | 1.55 | 1.56 | 1.55 | 1.55 |
| Appearance | Transparent | Transparent | Transparent | Transparent |
| Water vapor permeability (g/m$^2$ · 24 h) | 11.4 | 6.7 | 11.0 | 10.6 |

It was confirmed that the curable silicone composition of Practical Example 1 had a lower gas permeability than that of Comparative Example 1. Similarly, it was confirmed that the curable silicone composition of Practical Example 2 had a lower gas permeability than that of Comparative Example 2. In addition, it was confirmed that the curable silicone composition of Practical Example 3 had a lower gas permeability than that of Comparative Example 3. Furthermore, it was confirmed that the curable silicone composition of Practical Example 4 had a lower gas permeability than that of Comparative Example 4.

PRACTICAL EXAMPLE 6

62.0 parts by mass of the organopolysiloxane prepared in Reference Example 3, which is represented by the following average unit formula:

(MePhViSiO$_{1/2}$)$_{0.40}$(NaphSiO$_{3/2}$)$_{0.60}$ 38.0 parts by mass (at an amount where the number of silicon-bonded hydrogen atoms in the present component is 1 mole relative to 1 mole of vinyl groups in the above-mentioned organopolysiloxane) of the organopolysiloxane prepared in Reference Example 5, which is represented by the following formula:

HMePhSiOPh$_2$SiOSiMePhH and 0.25 parts by mass of a solution of a platinum-1,3-divinyl-1,1,3,3-tetramethyldisiloxane complex in 1,3,5,7-tetramethyl-1,3,5,7-tetravinylcyclotetrasiloxane (the solution containing 0.1% by mass of platinum) were mixed, thereby producing a curable silicone composition having a viscosity of 6.7 Pa·s. The refractive index and water vapor permeability of a cured product of this curable silicone composition were evaluated. These results are shown in Table 2.

PRACTICAL EXAMPLE 7

64.0 parts by mass of the organopolysiloxane prepared in Reference Example 4, which is represented by the following average unit formula:

(Me$_2$ViSiO$_{1/2}$)$_{0.40}$(NaphSiO$_{3/2}$)$_{0.60}$ 36.0 parts by mass (at an amount where the number of silicon-bonded hydrogen atoms in the present component is 1 mole relative to 1 mole of vinyl groups in the above-mentioned organopolysiloxane) of the organopolysiloxane prepared in Reference Example 5, which is represented by the following formula:

HMePhSiOPh$_2$SiOSiMePhH and 0.25 parts by mass of a solution of a platinum-1,3-divinyl-1,1,3,3-tetramethyldisiloxane complex in 1,3,5,7-tetramethyl-1,3,5,7-tetravinylcyclotetrasiloxane (the solution containing 0.1% by mass of platinum) were mixed, thereby producing a curable silicone composition having a viscosity of 3.8 Pa·s. The refractive index and water vapor permeability of a cured product of this curable silicone composition were evaluated. These results are shown in Table 2.

PRACTICAL EXAMPLE 8

45.5 parts by mass of the organopolysiloxane prepared in Reference Example 4, which is represented by the following average unit formula:

(Me$_2$ViSiO$_{1/2}$)$_{0.40}$(NaphSiO$_{3/2}$)$_{0.60}$ 15.0 parts by mass, of a methylphenylpolysiloxane capped at both molecular terminals with dimethylvinylsiloxy groups and having a viscosity of 3,000 mPa·s, 19.5 parts by mass (at an amount where the number of silicon-bonded hydrogen atoms in the present component is 0.38 moles relative to 1 mole of vinyl groups in the above-mentioned organopolysiloxane and the above-mentioned methylphenylpolysiloxane) of the organopolysiloxane prepared in Reference Example 6, which is represented by the following average formula:

HMePhSiO(Ph$_2$SiO)$_{2.5}$SiMePhH 20.0 parts by mass (at an amount where the number of silicon-bonded hydrogen atoms in the present component is 0.62 moles relative to 1 mole of vinyl groups in the above-mentioned organopolysiloxane and the above-mentioned methylphenylpolysiloxane) of the organopolysiloxane prepared in Reference Example 8, which is represented by the following average unit formula:

(HMePhSiO$_{1/2}$)$_{0.40}$(NaphSiO$_{3/2}$)$_{0.60}$ and 0.25 parts by mass of a solution of a platinum-1,3-divinyl-1,1,3,3-tetramethyldisiloxane complex in 1,3,5,7-tetramethyl-1,3,5,7-tetravinylcyclotetrasiloxane (the solution containing 0.1% by mass of platinum) were mixed, thereby producing a curable silicone composition having a viscosity of 13.0 Pa·s. The refractive index and water vapor permeability of a cured product of this curable silicone composition were evaluated. These results are shown in Table 2.

PRACTICAL EXAMPLE 9

47.0 parts by mass of the organopolysiloxane prepared in Reference Example 4, which is represented by the following average unit formula:

(Me$_2$ViSiO$_{1/2}$)$_{0.40}$(NaphSiO$_{3/2}$)$_{0.60}$ 38.0 parts by mass (at an amount where the number of silicon-bonded hydrogen atoms in the present component is 0.78 moles relative to 1 mole of vinyl groups in the above-mentioned organopolysiloxane) of the organopolysiloxane prepared in Reference Example 6, which is represented by the following average formula:

HMePhSiO(Ph$_2$SiO)$_{2.5}$SiMePhH 15.0 parts by mass (at an amount where the number of silicon-bonded hydrogen atoms in the present component is 0.22 moles relative to 1 mole of vinyl groups in the above-mentioned organopolysiloxane and the above-mentioned methylphenylpolysiloxane) of the organopolysiloxane prepared in Reference Example 9, which is represented by the following formula:

HMePhSiO(MePhSiO)$_6$SiMePhH and 0.25 parts by mass of a solution of a platinum-1,3-divinyl-1,1,3,3-tetramethyldisiloxane complex in 1,3,5,7-tetramethyl-1,3,5,7-tetravinylcyclotetrasiloxane (the solution containing 0.1% by mass of platinum) were mixed, thereby producing a curable silicone composition having a viscosity of 6.5 Pa·s. The refractive index and water vapor permeability of a cured product of this curable silicone composition were evaluated. These results are shown in Table 2.

PRACTICAL EXAMPLE 10

24.0 parts by mass of an organopolysiloxane represented by the following average unit formula:

(Me$_2$ViSiO$_{1/2}$)$_{0.25}$(PhSiO$_{3/2}$)$_{0.75}$ 29.0 parts by mass of the organopolysiloxane prepared in Reference Example 4, which is represented by the following average unit formula:

(Me$_2$ViSiO$_{1/2}$)$_{0.40}$(NaphSiO$_{3/2}$)$_{0.60}$ 15.0 parts by mass of a methylphenylpolysiloxane capped at both molecular terminals with dimethylvinylsiloxy groups and having a viscosity of 3,000 mPa·s, 12.0 parts by mass (at an amount where the number of silicon-bonded hydrogen atoms in the present component is 0.38 moles relative to 1 mole of vinyl groups in the above-mentioned two organopolysiloxanes and the above-mentioned methylphenylpolysiloxane) of the organopolysiloxane prepared in Reference Example 6, which is represented by the following average formula:

HMePhSiO(Ph$_2$SiO)$_{2.5}$SiMePhH 20.0 parts by mass (at an amount where the number of silicon-bonded hydrogen atoms in the present component is 0.62 moles relative to 1 mole of vinyl groups in the above-mentioned two organopolysiloxanes and the above-mentioned methylphenylpolysiloxane) of the organopolysiloxane prepared in Reference Example 8, which is represented by the following average unit formula:

(HMePhSiO$_{1/2}$)$_{0.40}$(NaphSiO$_{3/2}$)$_{0.60}$ and 0.25 parts by mass of a solution of a platinum-1,3-divinyl-1,1,3,3-tetramethyldisiloxane complex in 1,3,5,7-tetramethyl-1,3,5,7-tetravinylcyclotetrasiloxane (the solution containing 0.1% by mass of platinum) were mixed, thereby producing a curable silicone composition having a viscosity of 16.4 Pa·s. The refractive index and water vapor permeability of a cured product of this curable silicone composition were evaluated. These results are shown in Table 2.

COMPARATIVE EXAMPLE 5

71.0 parts by mass of the organopolysiloxane prepared in Reference Example 3, which is represented by the following average unit formula:

(MePhViSiO$_{1/2}$)$_{0.40}$(NaphSiO$_{3/2}$)$_{0.60}$ 29.0 parts by mass (at an amount where the number of silicon-bonded hydrogen atoms in the present component is 1 mole relative to 1 mole of vinyl groups in the above-mentioned organopolysiloxane) of an organopolysiloxane represented by the following formula:

HMe$_2$SiOPh$_2$SiOSiMe$_2$H and 0.25 parts by mass of a solution of a platinum-1,3-divinyl-1,1,3,3-tetramethyldisiloxane complex in 1,3,5,7-tetramethyl-1,3,5,7-tetravinylcyclotetrasiloxane (the solution contains 0.1% by mass of platinum) were mixed, thereby producing a curable silicone composition having a viscosity of 9.3 Pa·s. The refractive index and water vapor permeability of a cured product of this curable silicone composition were evaluated. These results are shown in Table 2.

COMPARATIVE EXAMPLE 6

68.5 parts by mass of the organopolysiloxane prepared in Reference Example 4, which is represented by the following average unit formula:

(Me$_2$ViSiO$_{1/2}$)$_{0.40}$(NaphSiO$_{3/2}$)$_{0.60}$ 31.5 parts by mass (at an amount where the number of silicon-bonded hydrogen atoms in the present component is 1 mole relative to 1 mole of vinyl groups in the above-mentioned organopolysiloxane) of an organopolysiloxane represented by the following formula:

HMe$_2$SiOPh$_2$SiOSiMe$_2$H and 0.25 parts by mass of a solution of a platinum-1,3-divinyl-1,1,3,3-tetramethyldisiloxane complex in 1,3,5,7-tetramethyl-1,3,5,7-tetravinylcyclotetrasiloxane (the solution containing 0.1% by mass of platinum) were mixed, thereby producing a curable silicone composition having a viscosity of 9.3 Pa·s. The refractive index and water vapor permeability of a cured product of this curable silicone composition were evaluated. These results are shown in Table 2.

COMPARATIVE EXAMPLE 7

47.0 parts by mass of the organopolysiloxane prepared in Reference Example 4, which is represented by the following average unit formula:

(Me$_2$ViSiO$_{1/2}$)$_{0.40}$(NaphSiO$_{3/2}$)$_{0.60}$ 15.0 parts by mass of a methylphenylpolysiloxane capped at both molecular terminals with dimethylvinylsiloxy groups and having a viscosity of 3,000 mPa·s, 33.0 parts by mass (at an amount where the number of silicon-bonded hydrogen atoms in the present component is 0.76 moles relative to 1 mole of vinyl groups in the above-mentioned organopolysiloxane and the above-mentioned methylphenylpolysiloxane) of an organopolysiloxane represented by the following average formula:

HMe$_2$SiO(Ph$_2$SiO)$_{2.5}$SiMe$_2$H 5.0 parts by mass (at an amount where the number of silicon-bonded hydrogen atoms in the present component is 0.24 moles relative to 1 mole of vinyl groups in the above-mentioned organopolysiloxane and the above-mentioned methylphenylpolysiloxane) of an organopolysiloxane represented by the average unit formula:

(HMe$_2$SiO$_{1/2}$)$_{0.60}$(PhSiO$_{3/2}$)$_{0.40}$ and 0.25 parts by mass of a solution of a platinum-1,3-divinyl-1,1,3,3-tetramethyldisiloxane complex in 1,3,5,7-tetramethyl-1,3,5,7-tetravinylcyclotetrasiloxane (the solution containing 0.1% by mass of platinum) were mixed, thereby producing a curable silicone composition having a viscosity of 16.5 Pa·s. The refractive index and water vapor permeability of a cured product of this curable silicone composition were evaluated. These results are shown in Table 2.

TABLE 2

| Item | Category Present invention | | | | |
|---|---|---|---|---|---|
| | Practical Example 6 | Practical Example 7 | Practical Example 8 | Practical Example 9 | Practical Example 10 |
| Refractive index | 1.60 | 1.61 | 1.60 | 1.59 | 1.58 |
| Appearance | Transparent | Transparent | Transparent | Transparent | Transparent |
| Water vapor permeability (g/m$^2$ · 24 h) | 1.9 | 1.8 | 3.4 | 4.3 | 4.2 |

| Item | Category Comparative Examples | | |
|---|---|---|---|
| | Comparative Example 5 | Comparative Example 6 | Comparative Example 7 |
| Refractive index | 1.60 | 1.59 | 1.58 |
| Appearance | Transparent | Transparent | Transparent |
| Water vapor permeability (g/m$^2$ · 24 h) | 2.4 | 2.9 | 4.7 |

It was confirmed that the curable silicone composition of Practical Example 6 had a lower viscosity and a lower gas permeability of the cured product than that of Comparative Example 5. In addition, it was confirmed that the curable silicone composition of Practical Example 7 had a lower viscosity and a lower gas permeability of the cured product than that of Comparative Example 6.

INDUSTRIAL APPLICABILITY

The curable silicone composition of the present invention can be used as an electrical or electronic adhesive agent, bonding agent, protective agent, coating agent, or underfill agent, has high reactivity, and can form a cured product having a low gas permeability, and is therefore suitable for use as a sealing agent or protective coating material for an optical semiconductor element in an optical semiconductor device such as a light emitting diode (LED).

DESCRIPTION OF SYMBOLS

1 Optical semiconductor element
2 Lead frame
3 Lead frame
4 Bonding wire
5 Frame material
6 Cured product of curable silicone composition

The invention claimed is:
1. A curable silicone composition comprising:
(A) an organopolysiloxane having at least two alkenyl groups in a molecule and represented by the following average unit formula:

(R$^1$R$^2_2$SiO$_{1/2}$)$_a$(R$^3_2$SiO$_{2/2}$)$_b$(R$^4$SiO$_{3/2}$)$_c$ wherein, R$^1$ is an alkenyl group having from 2 to 12 carbons; each R$^2$ is the same or different, and are each an alkyl group having from 1 to 12 carbons, an alkenyl group having from 2 to 12 carbons, an aryl group having from 6 to 20 carbons, or an aralkyl group having from 7 to 20 carbons; each R$^3$ is the same or different, and are each an alkyl group having from 1 to 12 carbons, an alkenyl group having from 2 to 12 carbons, or a phenyl group; R$^4$ is an aryl group having from 6 to 20 carbons or an aralkyl group having from 7 to 20 carbons; and a, b, and c are numbers that satisfy the following conditions: 0.01≤a≤0.5, 0≤b≤0.7, 0.1≤c<0.9, and a+b+c=1;
(B) a straight chain organopolysiloxane having at least two alkenyl groups in a molecule and having no silicon-bonded hydrogen atoms, in an amount of 0 to 70% by mass of this composition;
(C) an organosiloxane (C$_1$) represented by the following general formula:

HR$^5$R$^6$SiO(R$^7_2$SiO)$_n$SiR$^5$R$^6$H wherein, each R$^5$ is the same or different, and are each an alkyl group having from 1 to 12 carbons; each R$^6$ is the same or different, and are each an aryl group having from 6 to 20 carbons or an aralkyl group having from 7 to 20 carbons; each R$^7$ is the same or different, and are each an alkyl group having from 1 to 12 carbons or a phenyl group; and n is a number from 0 to 100,
an organopolysiloxane (C$_2$) having at least two silicon-bonded hydrogen atoms in a molecule and represented by the following average unit formula:

(HR$^5$R$^6$SiO$_{1/2}$)$_d$(HR$^5_2$SiO$_{1/2}$)$_e$(R$^7_2$SiO$_{2/2}$)$_f$(R$^6$SiO$_{3/2}$)$_g$ wherein, $R^5$, $R^6$, and $R^7$ are as defined above; and d, e, f, and g are numbers that satisfy the following conditions: $0.01 \leq d \leq 0.7$, $0 \leq e \leq 0.5$, $0 \leq f \leq 0.7$, $0.1 \leq g < 0.9$, and $d+e+f+g=1$, or a mixture of components ($C_1$) and ($C_2$), in an amount such that the number of silicon-bonded hydrogen atoms in this component is from 0.1 to 5 moles per 1 mol of total alkenyl groups in components (A) and (B); and (D) an effective quantity of a hydrosilylation reaction catalyst.

2. The curable silicone composition according to claim 1, wherein $R^4$ in component (A) is a phenyl group or a naphthyl group.

3. The curable silicone composition according to claim 1, wherein $R^6$ in component (C) is a phenyl group or a naphthyl group.

4. The curable silicone composition according to claim 1, wherein in the mixture of components ($C_1$) and ($C_2$), a mass ratio of component ($C_1$) to component ($C_2$) is from 0.5:9.5 to 9.5:0.5.

5. The curable silicone composition according to claim 1, wherein n in component ($C_1$) is a number from 1 to 10 and at least one $R^7$ in a molecule is a phenyl group.

6. The curable silicone composition according to claim 1, further comprising (E) an adhesion-imparting agent, being comprised at a quantity of 0.01 to 10 parts by mass per 100 parts total mass of components (A) to (D).

7. A cured product obtained by curing the curable silicone composition of claim 1.

8. An optical semiconductor device comprising an optical semiconductor element sealed by a cured product of the curable silicone composition of claim 1.

9. The curable silicone composition according to claim 2, further comprising (E) an adhesion-imparting agent, being comprised at a quantity of 0.01 to 10 parts by mass per 100 parts total mass of components (A) to (D).

10. The curable silicone composition according to claim 3, further comprising (E) an adhesion-imparting agent, being comprised at a quantity of 0.01 to 10 parts by mass per 100 parts total mass of components (A) to (D).

11. The curable silicone composition according to claim 4, further comprising (E) an adhesion-imparting agent, being comprised at a quantity of 0.01 to 10 parts by mass per 100 parts total mass of components (A) to (D).

12. The curable silicone composition according to claim 5, further comprising (E) an adhesion-imparting agent, being comprised at a quantity of 0.01 to 10 parts by mass per 100 parts total mass of components (A) to (D).

13. The curable silicone composition according to claim 1, wherein each of $R^4$ in component (A) and each $R^6$ in component (C) is independently a phenyl group or a naphthyl group.

14. The curable silicone composition according to claim 1, wherein $R^1$ in component (A) is a vinyl group, wherein each $R^2$ in component (A) is a vinyl group, wherein each $R^3$ in component (A) is a methyl group, wherein $R^4$ in component (A) is a phenyl group or a naphthyl group, wherein each $R^5$ in component (C) is a methyl group, wherein each $R^6$ in component (C) is a phenyl group or a naphthyl group, and wherein each $R^7$ in component (C) is a methyl group.

15. A cured product obtained by curing the curable silicone composition of claim 2.

16. An optical semiconductor device comprising an optical semiconductor element sealed by a cured product of the curable silicone composition of claim 2.

* * * * *